(12) United States Patent
Lin et al.

(10) Patent No.: US 9,330,746 B2
(45) Date of Patent: May 3, 2016

(54) RESISTIVE MEMORY ARRAY

(71) Applicant: Taiwan Semiconductor Manufacturing CO., LTD., Hsinchu (TW)

(72) Inventors: Kai-Chun Lin, Hsinchu (TW); Hung-Chang Yu, HsinChu (TW); Ku-Feng Lin, New Taipei (TW); Yue-Der Chih, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 100 days.

(21) Appl. No.: 14/219,350

(22) Filed: Mar. 19, 2014

(65) Prior Publication Data

US 2015/0269997 A1    Sep. 24, 2015

(51) Int. Cl.
*G11C 13/00* (2006.01)
*G11C 11/16* (2006.01)

(52) U.S. Cl.
CPC ........ *G11C 11/1655* (2013.01); *G11C 11/1675* (2013.01); *G11C 13/0026* (2013.01); *G11C 13/0069* (2013.01); *G11C 2013/0083* (2013.01); *G11C 2213/79* (2013.01); *G11C 2213/82* (2013.01)

(58) Field of Classification Search
CPC .................................................. G11C 13/0069
USPC ........................................................ 365/148
See application file for complete search history.

(56) References Cited

U.S. PATENT DOCUMENTS

| 6,236,611 | B1* | 5/2001 | Naji ...................... | G11C 5/145 365/226 |
| 6,512,706 | B1* | 1/2003 | Arnold ................. | G11C 7/1039 365/189.05 |
| 2008/0239798 | A1* | 10/2008 | Sheu .................... | G11C 7/1078 365/163 |
| 2010/0309716 | A1* | 12/2010 | Tsukada ................ | G11C 5/145 365/163 |

OTHER PUBLICATIONS

Yu, Hung-Chang et al., "Cycling Endurance Optimization Scheme for 1Mb STT-MRAM in 40nm Technology", *IEEE International Solid-State Circuits Conference* 2013, pp. 224-226.

* cited by examiner

*Primary Examiner* — Min Huang (57) ABSTRACT

A circuit that includes a current source module, a current sink module and a memory bank is disclosed. Each of the current source module, the current sink module and the memory bank is connected to the first bit/source line and the second bit/source line. The memory bank is bounded by the current source module and the current sink module. When the current source module and the current sink module receive a triggering pulse from the first bit/source line and a select signal with a first state, the current source module is activated to generate an operating current to the first bit/source line that transmits through a conducted memory cell of the memory bank and the current sink module is activated to drain the operating current from the second bit/source line.

20 Claims, 4 Drawing Sheets

RESISTIVE MEMORY ARRAY

BACKGROUND

Resistive random access memory (RRAM) devices include resistive memory cells that store data based on a resistance level of a storage element. The cells are operatively programmed to a desired state corresponding to a particular resistance level. In some approaches, the cells are programmed by applying positive or negative voltages to the cells for a particular duration.

BRIEF DESCRIPTION OF THE DRAWINGS

The disclosure can be more fully understood by reading the following detailed description of the embodiment, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

In the following description, specific details are presented to generate a thorough understanding of the embodiments of the present disclosure. Persons of ordinary skill in the art will recognize, however, that the present disclosure can be practiced without one or more of the specific details, or in combination with other components. Well-known implementations or operations are not shown or described in detail to avoid obscuring aspects of various embodiments of the present disclosure.

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

It will be understood that, although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

As used herein, the terms "comprising," "including," "having," "containing," "involving," and the like are to be understood to be open-ended, i.e., to mean including but not limited to.

Reference throughout the specification to "one embodiment" or "an embodiment" means that a particular feature, structure, implementation, or characteristic described in connection with the embodiment is included in at least one embodiment of the present disclosure. Thus, uses of the phrases "in one embodiment" or "in an embodiment" in various places throughout the specification are not necessarily all referring to the same embodiment. Furthermore, the particular features, structures, implementation, or characteristics may be combined in any suitable manner in one or more embodiments.

Figure 1:
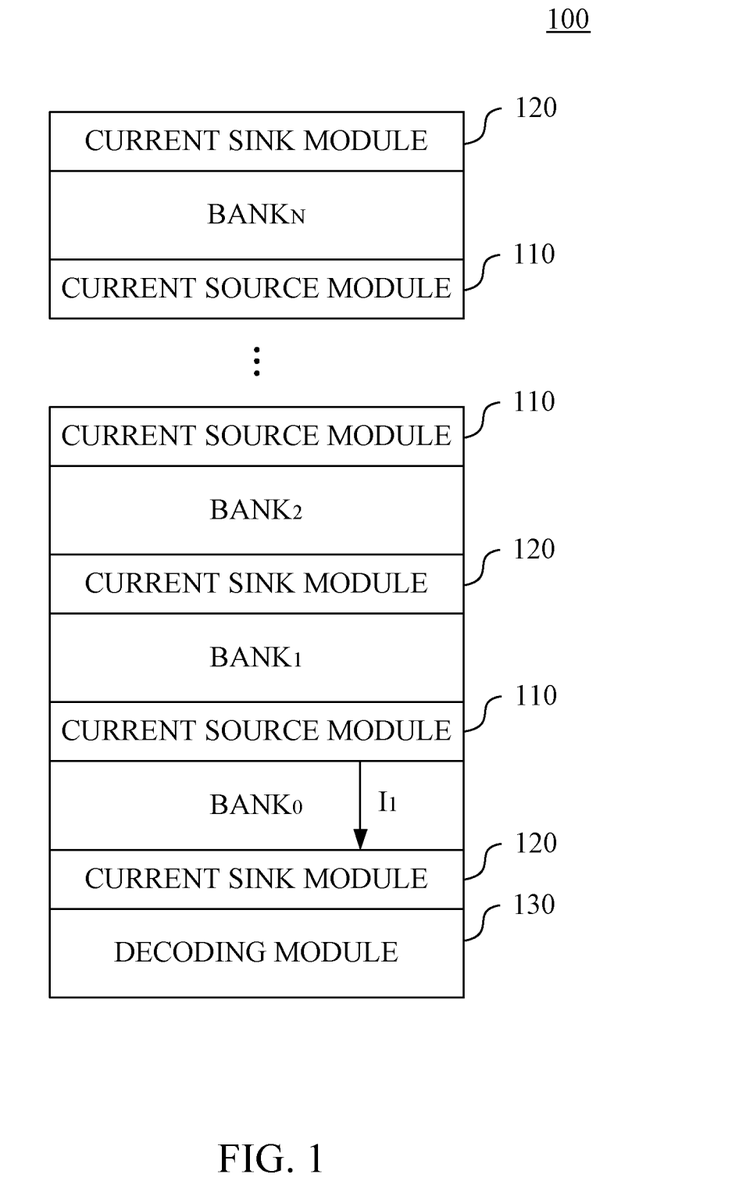
FIG. 1 is an exemplary diagram of a memory array in accordance with various embodiments of the present disclosure.

FIG. 1 is an exemplary diagram of a resistive memory array 100 in accordance with various embodiments of the present disclosure.

The resistive memory array 100 includes a plurality of current source modules 110, a plurality of current sink modules 120, a plurality of memory banks $BANK_0$, $BANK_1$, $BANK_2$, ... $BANK_N$ and a decoding module 130.

The current source modules 110 and the current sink modules 120 are arranged in an interlaced manner.

Each of the memory banks $BANK_0$-$BANK_N$ is bounded by one of the current source modules 110 and one of the current sink modules 120 that are neighboring to each other. Explained in a different way, each pair of the memory banks $BANK_0$-$BANK_N$ either shares one of the current source modules 110 or shares one of the current sink modules 120. For illustration, the memory banks $BANK_0$ and $BANK_1$ share one of the current source modules 110. The memory banks $BANK_1$ and $BANK_2$ share one of the current source modules 120.

The decoding module 130 is configured to control the operations of the current source modules 110 and the current sink modules 120. Each of the current source modules 110 is activated by the decoding module 130 to generate an operating current to the neighboring memory bank to operate the memory cells (not illustrated) therein. Similarly, each of the current sink modules 120 is activated by the decoding module 130 to drain the operating current from the neighboring memory bank.

For example, when the current source module 110 and the current sink module 120 that bound the memory bank $BANK_0$ are activated, the current source module 110 generates an operating current $I_1$ to the memory bank $BANK_0$. After the operating current $I_1$ flows through the memory bank $BANK_0$, the current sink module 120 sinks the operating current $I_1$ from the memory bank $BANK_0$.

Figure 2:
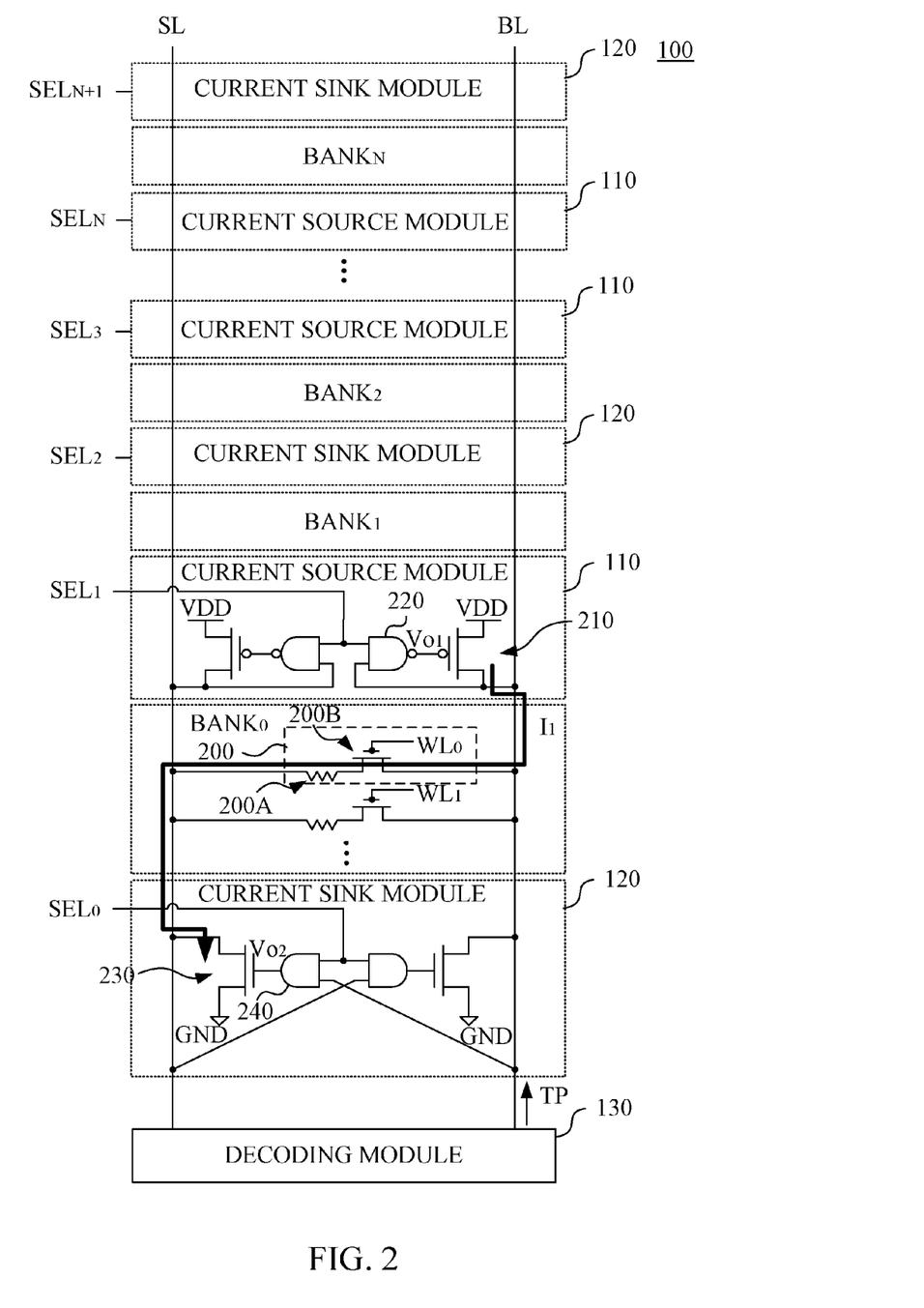
FIG. 2 is an exemplary diagram of the memory array in accordance with various embodiments of the present disclosure.

FIG. 2 is an exemplary diagram of the resistive memory array 100 in accordance with various embodiments of the present disclosure, in which detail circuits of the memory bank $BANK_0$ and the current source module 110 and the current sink module 120 that bound the memory bank $BANK_0$ are illustrated.

Each of the current source modules 110, the current sink modules 120 and the memory banks $BANK_0$-$BANK_N$ is connected to a bit line BL and a source line SL, as illustrated in FIG. 2.

In some embodiments, the memory bank $BANK_0$ includes a plurality of memory cells 200. In some embodiments, each of the memory cells 200 includes a resistive memory device 200A and an access transistor 200B connected in series. In some embodiments, the resistive memory device 200A is a resistive random access memory (RRAM) device or a magnetoresistive random-access memory (MRAM) device. The access transistor 200B is connected to a word line, e.g., the word line $WL_0$ or the word line $WL_1$ illustrated in FIG. 2.

Different operations of the memory cells 200, such as a forming operation, a set operation and a reset operation, are performed with different voltages and currents applied on the memory cells 200.

In some embodiments, one of the memory cells 200 is conducted when the access transistor 200B thereof are activated. For illustration, the bit line BL associated with the memory cell 200 is driven by an operating current $I_1$ in FIG. 2. The set operation or the forming operation of the conducted memory cell 200 is performed according to the operating current $I_1$. More specifically, when a memory cell 200 is conducted, the resistive state of the resistive memory device 200A gradually switches from a high resistive state to a low resistive state according to the operating current $I_1$.

For illustration in FIG. 2, the current source module 110 and the current sink module 120 are configured to operate the memory cells 200, in which the operating current $I_1$ is generated by the current source module 110 and is drained by the current sink module 120.

The current source module 110 includes a current source unit 210 and a logic gate 220.

In some embodiments, the current source unit 210 is a PMOS transistor, in which the source terminal and the drain terminal of the PMOS transistor are connected to a voltage source VDD and the bit line BL, respectively. When the current source unit 210 is activated, the operating current $I_1$ is generated therefrom.

In some embodiments, the logic gate 220 is a NAND gate. The logic gate 220 includes an output end and two input ends. For illustration, the output end is connected to the current source unit 210. More specifically, the output end of the logic gate 220 is connected to a gate terminal of the PMOS transistor. Further, though not illustrated in FIG. 2, one of the two input ends is substantially connected to the decoding module 130 to receive a select signal $SEL_1$. The other one of the two input ends is connected to the bit line BL.

The current sink module 120 includes a current sink unit 230 and a logic gate 240.

In some embodiments, the current sink unit 230 is an NMOS transistor, in which the source terminal and the drain terminal of the NMOS transistor are connected to the source line SL and a ground terminal GND, respectively. When the current sink unit 230 is activated, the operating current $I_1$ is drained thereto.

In some embodiments, the logic gate 240 is an AND gate. The logic gate 240 includes an output end and two input ends. For illustration, the output end is connected to the current sink unit 230. More specifically, the output end of the logic gate 240 is connected to a gate terminal of the NMOS transistor. Further, though not illustrated in FIG. 2, one of the two input ends is substantially connected to the decoding module 130 to receive a select signal $SEL_0$. The other one of the two input ends is connected to the source line SL.

The decoding module 140 is connected to the current source module 110, the current sink module 120, the bit line BL and the source line SL. The decoding module 140 controls the operation of the current source module 110 and the current sink module 120.

Figure 3:
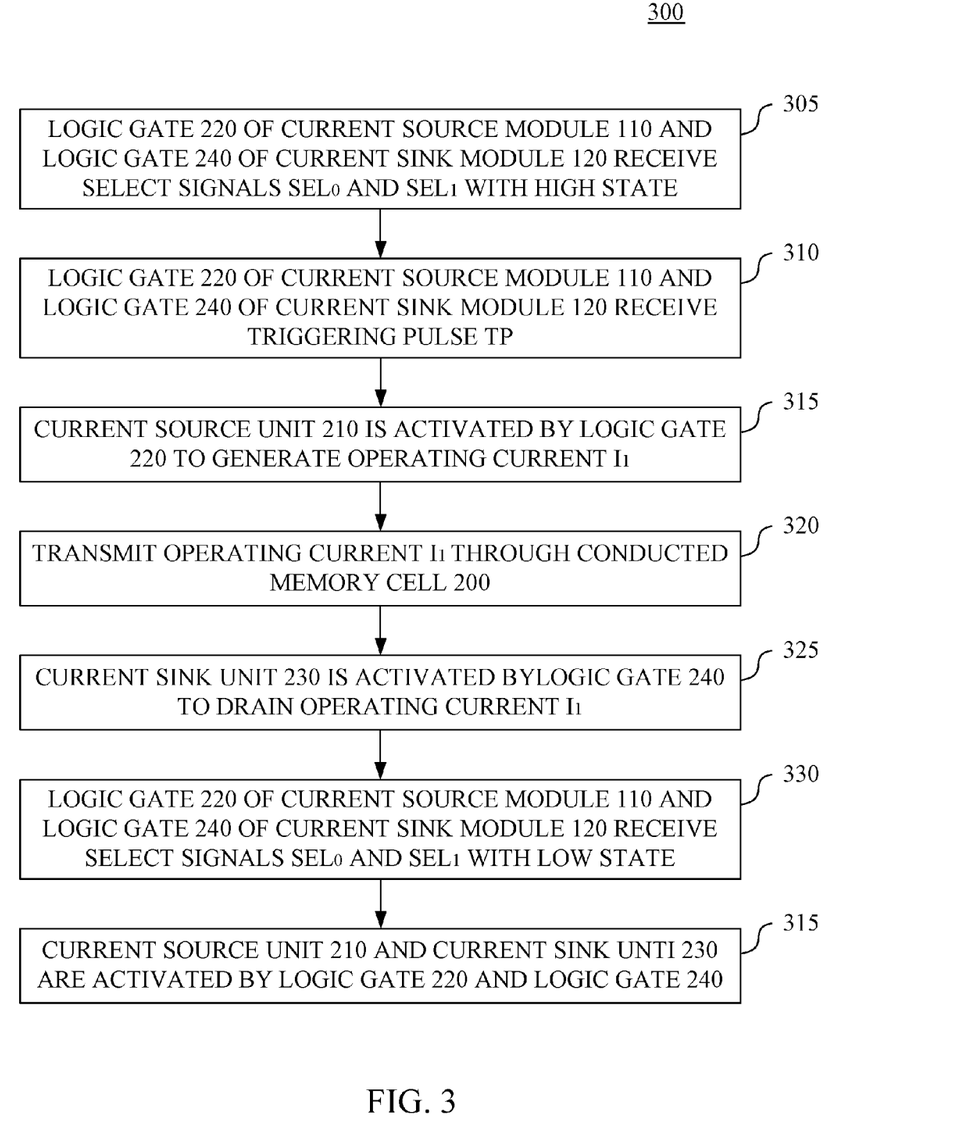
FIG. 3 is a flow chart of an operating method in accordance with various embodiments of the present disclosure.

FIG. 3 is a flow chart of an operating method 300 in accordance with various embodiments of the present disclosure. In some embodiments, the operating method 300 is applied in the resistive memory array 100 illustrated in FIG. 2. For illustration, operations of the resistive memory array 100 illustrated in FIG. 2 are described by the operating method 300.

In operation 305, each of the current source module 110 and the current sink module 120 associated with the memory bank $BANK_0$ receives a select signal. The select signal is of a first state and is generated by the decoding module 140. For illustration, the current source module 110 and the current sink module 120 associated with the memory bank $BANK_0$ are neighboring to each other and bound the memory bank $BANK_0$.

In some embodiments, the first state is a high state.

For illustration, one of the two inputs of the logic gate 220 of the current source module 110 receives the select signal $SEL_1$ with the high state. Moreover, one of the two inputs of the logic gate 240 of the current sink module 120 receives the select signal $SEL_0$ with the high state.

In operation 310, each of the current source module 110 and the current sink module 120 associated with the memory bank $BANK_0$ receives a triggering pulse TP from the bit line BL. The triggering pulse TP is generated by the decoding module 140.

For illustration, the other one of the two inputs of the logic gate 220 receives the triggering pulse TP. Moreover, the other one of the two inputs of the logic gate 240 receives the triggering pulse TP. In some embodiments, the triggering pulse TP is a high state pulse. More specifically, the triggering pulse TP is a pulse that rises from a low state to a high state within a duration and falls back to the low state.

In operation 315, the current source module 110 is activated to generate an operating current $I_1$ to the bit line BL.

The logic gate 220, which, in some embodiments, is a NAND gate, generates an output signal $Vo_1$ at the output end. Since the select signal $SEL_1$ is at the high state and the triggering pulse TP is a high state pulse, the output signal $Vo_1$ is at a low state during the duration of the triggering pulse TP. The current source unit 210, which, in some embodiments, is a PMOS transistor, is activated by the output signal $Vo_1$ to generate the operating current $I_1$ to the bit line BL.

As a result, the voltage level of the bit line BL is pulled high by the operating current $I_1$. The voltage at the bit line BL is fed back to the input end of the logic gate 220 that receives the triggering pulse TP. Consequently, as long as the logic gate 220 receives the select signal $SEL_1$ with the high state, the logic gate 220 keeps generating the output signal $Vo_1$ with the low state. Moreover, the current source unit 210 is kept to be activated by the output signal $Vo_1$ to generate the operating current $I_1$.

As a result, a self-enable mechanism is accomplished to form a positive feedback loop between the logic gate 220 and the current source unit 210 to keep the current source module 110 being activated.

In operation 320, the operating current $I_1$ is transmitted through the conducted memory cell 200 of the memory bank $BANK_0$.

In some embodiments, the memory cell 200 associated with the word line $WL_0$ is conducted. In such condition, the access transistor 200B is activated. As a result, the resistive memory device 200A is conducted. Consequently, the memory cell 200 is conducted, and the operating current $I_1$ flows through the memory cell 200. In some embodiments, the operating current $I_1$ flows from the bit line BL to the source line SL. An operation, such as a forming operation or a set operation, is performed on the memory cell 200 by the operating current $I_1$.

In operation 325, the current sink module 120 is activated to drain the operating current $I_1$ from the source line SL.

The logic gate 240, which, in some embodiments, is an AND gate, generates an output signal $Vo_2$ at the output end. Since the select signal $SEL_0$ is at the high state and the triggering pulse TP is a high state pulse, the output signal $Vo_2$ is at a high state during the duration of the triggering pulse TP.

The current sink unit 230, which, in some embodiments, is an NMOS transistor, is activated by the output signal $Vo_2$ to drain the operating current $I_1$ from the source line SL.

Due to the positive feedback loop mentioned above, the voltage level of the bit line BL is pulled high by the operating current $I_1$. The voltage at the bit line BL is fed back to the input end of the logic gate 240 that receives the triggering pulse TP. Consequently, as long as the logic gate 240 receives the select signal $SEL_0$ with the high state, the logic gate 240 keeps generating the output signal $Vo_1$ with the high state. Moreover, the current sink unit 230 is kept to be activated by the output signal $Vo_2$ to drain the operating current $I_1$.

As a result, a self-enable mechanism is accomplished to form a positive feedback loop between the logic gate 240 and the current sink unit 230 to keep the current sink module 120 being activated.

In some embodiments, the operations 315, 320 and 325 are substantially performed about the same time to form the current path between the current source module 110 and the current sink module 120 to operate the memory cell 200.

In operation 330, each of the current source module 110 and the current sink module 120 neighboring to each other and bounding the memory bank $BANK_0$ receives the select signal. The select signal is of a second state opposite to the first state and is generated by the decoding module 140. In some embodiments, the second state is a low state.

For illustration, the input of the logic gate 220 corresponding to the select signal $SEL_1$ receives the select signal $SEL_1$ with the low state. Moreover, the input of the logic gate 240 corresponding to the select signal $SEL_0$ receives the select signal $SEL_0$ with the low state.

In operation 335, the current source module 110 and the current sink module 120 are deactivated by the select signals $SEL_1$ and $SEL_0$ respectively.

Since the select signal $SEL_1$ is at the low state, the output signal $Vo_1$ generated by the logic gate 220, which, in some embodiments, is a NAND gate, is at the high state. The current source unit 210, which is a PMOS transistor, is deactivated by the output signal $Vo_1$. Moreover, since the select signal $SEL_1$ is at the low state, the output signal $Vo_2$ generated by the logic gate 240, which, in some embodiments, is a NAND gate, is at the low state. The current sink unit 230, which, in some embodiments, is a NMOS transistor, is deactivated by the output signal $Vo_1$.

Base on the operation of the resistive memory array 100, a self-enable mechanism is presented to activate the current source module 110 and the current sink module 120 that bound the memory bank supposed to be operated. The current source module 110 and the current sink module 120 are activated with the triggering pulse TP and the select signals $SEL_1$ and $SEL_0$ transmitted by the decoding module 140 to generate and drain the operating current $I_1$. Complex design of local decoding circuits is avoided. Moreover, the short transporting distance of the operating current $I_1$ within the local memory bank results in low IR drop and less current consumption.

In some embodiments, for the current source module 110 and the current sink module 120 that bound the memory bank that are not supposed to be operated, the decoding module 140 generates the select signals with the low state thereto. For example, the memory banks $BANK_1$, $BANK_2$, ... and $BANK_N$ are not supposed to be operated when the memory bank $BANK_0$ is operated. The decoding module 140 generates the select signal $SEL_2$, $SEL_3$, ... $SEL_N$ and $SEL_{N+1}$ with the low state to deactivate the current source module 110 and the current sink module 120 corresponding to the memory banks $BANK_1$, $BANK_2$, ... and $BANK_N$.

In some embodiments, other memory banks are operated by using the operations described above. For example, the memory cells in the memory bank $BANK_1$ are operated by transmitting the select signals $SEL_1$ and $SEL_2$ with the high state and the triggering pulse TP. The current source module 110 and the current sink module 120 that bound the memory bank $BANK_1$ are activated to generate and drain the operating current that flows through the memory bank $BANK_1$. In another example, the memory cells in the memory bank $BANK_N$ are operated by transmitting the select signals $SEL_N$ and $SEL_{N+1}$ with the high state and the triggering pulse TP. The current source module 110 and the current sink module 120 that bound the memory bank $BANK_N$ are activated to generate and drain the operating current that flows through the memory bank $BANK_N$.

In some embodiments, the configuration of the current source modules 110 and the current sink module 120 related to the memory banks $BANK_0$-$BANK_N$ are inversed. The same operations are performed on the current source modules 110 and the current sink module 120 with the inversed configuration.

Figure 4:
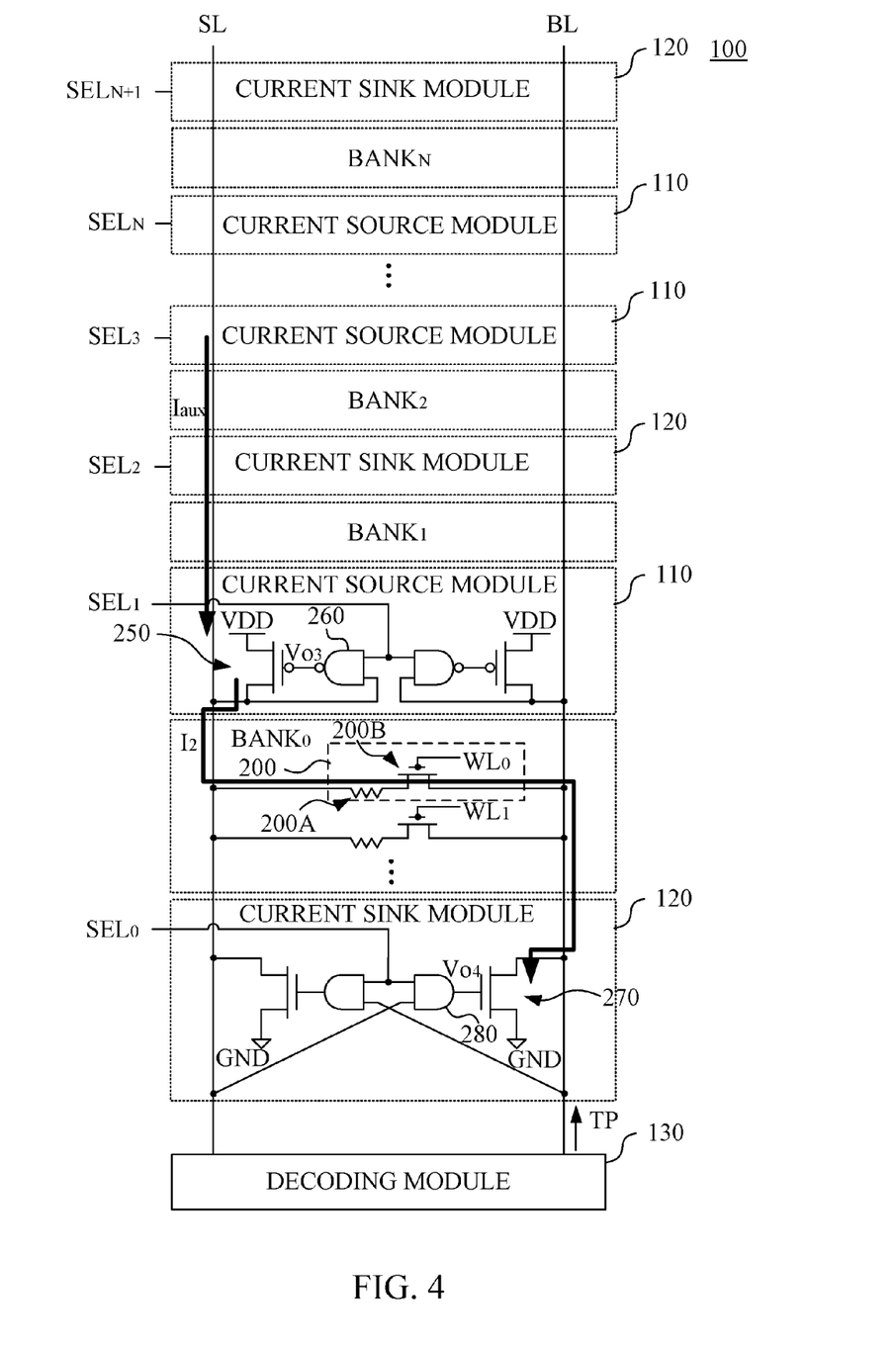
FIG. 4 is an exemplary diagram of the memory array in an alternative operation state in accordance with various embodiments of the present disclosure.

FIG. 4 is an exemplary diagram of the resistive memory array 100 in an alternative operation state in accordance with various embodiments of the present disclosure;

For illustration in FIG. 4, the current source module 110 further includes a current source unit 250 and a logic gate 260. The current sink module 120 further includes a current sink unit 270 and a logic gate 280.

The current source unit 250 and the logic gate 260 substantially have the same structure as that of the current source unit 210 and the logic gate 220, instead that the current source unit 250 and the logic gate 260 are connected to the source line SL.

In operation, when the two input ends of the logic gate 260 receive the select signal $SEL_1$ with the high state and the triggering pulse TP through the source line SL, the current source module 250 is activated by the output signal $Vo_3$ at the output end of the logic gate 260. The activated current source module 250 generates the operating current $I_2$ to the source line SL.

Moreover, the current sink unit 270 and the logic gate 280 substantially have the same structure as that of the current sink unit 230 and the logic gate 240, instead that the current sink unit 270 and the logic gate 280 are connected to the bit line BL.

When the two input ends of the logic gate 280 receive the select signal $SEL_0$ with the high state and the triggering pulse TP through the source line SL, the current source module 250 is activated by the output signal $Vo_4$ at the output end of the logic gate 280. The activated current sink module 270 drains the operating current $I_2$ from the bit line BL.

Based on the operation of the current source unit 250, the logic gate 260, the current sink unit 270 and the logic gate 280, the reset operation of the conducted memory cell 200 is performed according to the operating current $I_2$. More specifically, when a memory cell 200 is conducted, the resistive state of the resistive memory device 200A gradually switches from a low resistive state to a high resistive state according to the operating current $I_2$.

In some embodiments, a large operating current is needed to operate the memory cell 200. Under such a condition, two or more than two current source modules 110 are activated. The additional current source modules 110 generate an auxiliary operating current. For example, as illustrated in FIG. 4, the decoding module 140 transmits the select signals $SEL_3$, $SEL_1$ and $SEL_0$ with the high state and transmits the triggering pulse TP to the source line SL. As a result, not only the current source module 110 and the current sink module 120 that bound the memory band BANK₀ are activated, but also the current source module 110 neighboring to the memory band BANK₂ is activated. The current source module 110 neighboring to the memory band BANK₂ generates an auxiliary operating current $1_{aux}$. The memory cell 200 in the memory bank BANK₀ is operated by a larger operating current that is the sum of the operating current I₁ and the auxiliary operating current $1_{aux}$.

In some embodiments, other memory banks are operated by using the operations described above. For example, the memory cells in the memory bank BANK₁ are operated according to the operating current from the current source module 110 corresponding to the select signal SEL₁ and the auxiliary operating current from the current source module 110 corresponding to the select signal SEL₃.

In some embodiments, a circuit that includes a current source module, a current sink module and a memory bank is disclosed. The current source module is connected to a first bit/source line and a second bit/source line. The current sink module is connected to the first bit/source line and the second bit/source line. The memory bank is connected to the first bit/source line and the second bit/source line and is bounded by the current source module and the current sink module. When each of the current source module and the current sink module receives a triggering pulse from the first bit/source line and a select signal with a first state, the current source module is activated to generate an operating current to the first bit/source line that transmits through a conducted memory cell of the memory bank and the current sink module is activated to drain the operating current from the second bit/source line.

Also disclosed is a circuit that includes a plurality of current source modules, a plurality of current sink modules, a plurality of memory banks and a decoding module. The current source modules and the current sink modules are arranged in an interlaced manner, wherein each of the current source modules and the current sink modules is connected to a first bit/source line and a second bit/source line. Each of the memory banks is connected to the first bit/source line and the second bit/source line and is bounded by one of the current source modules and one of the current sink modules neighboring to each other. The decoding module is connected to the current source modules, the current sink modules, the first bit/source line and the second bit/source line. When each of a selected one of the current source modules and a selected one of the current sink modules neighboring to each other receives a select signal with a first state generated by the decoding module and receive a triggering pulse from the first bit/source line generated by the decoding module, the selected one of the current source modules is activated to generate an operating current to the first bit/source line that transmits through a conducted memory cell of one of the memory banks bounded by the selected one of the current source modules and the selected one of the current sink modules, and the selected one of the current sink modules is activated to drain the operating current from the second bit/source line.

Also disclosed is a method that includes the operations outlined below. A select signal with a first state is received by each of a selected one of a plurality of current source modules and a selected one of a plurality of current sink modules neighboring to each other, wherein the current source modules and the current sink modules are arranged in an interlaced manner and each of the current source modules and the current sink modules is connected to a first bit/source line and a second bit/source line. A triggering pulse from the first bit/source line is received by the selected one of the current source modules and the selected one of the current sink modules. The selected one of the current source modules is activated to generate an operating current to the first bit/source line. The operating current is transmitted through a conducted memory cell of one of a plurality of memory banks between the selected one of the current source modules and the selected one of the current sink modules. The selected one of the current sink modules is activated to drain the operating current from the second bit/source line.

In this document, the term "connected" may be termed as "electrically connected", and the term "coupled" may be termed as "electrically coupled". "Connected" and "coupled" may also be used to indicate that two or more elements cooperate or interact with each other.

The number and configuration of the resistive memory cells and the resistive memory array therein in this document are for illustrative purposes. Various numbers and configurations of the resistive memory cells and the resistive memory cell array therein are within the contemplated scope of the present disclosure.

The number and configuration of the current source unit and the logic gate therein in this document are for illustrative purposes. Various numbers and configurations of the current source unit and the logic gate therein are within the contemplated scope of the present disclosure. In some embodiments, under a proper design, other logic gates such as, but not limited to AND gate, OR gate, NOR gate, XOR gate can be used.

The number and configuration of the current sink unit and the logic gate therein in this document are for illustrative purposes. Various numbers and configurations of the current sink unit and the logic gate therein are within the contemplated scope of the present disclosure. In some embodiments, under a proper design, other logic gates such as, but not limited to NAND gate, OR gate, NOR gate, XOR gate can be used.

The above illustrations include exemplary operations, but the operations are not necessarily performed in the order shown. Operations may be added, replaced, changed order, and/or eliminated as appropriate, in accordance with the spirit and scope of various embodiments of the present disclosure.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

What is claimed is:

1. A circuit comprising:
    a current source module connected to a first bit/source line and a second bit/source line;
    a current sink module connected to the first bit/source line and the second bit/source line; and
    a memory bank connected to the first bit/source line and the second bit/source line and bounded by the current source module and the current sink module;
    wherein when each of the current source module and the current sink module receives a triggering pulse from the first bit/source line and a select signal with a first state, the current source module is activated to generate an operating current, and to transmit the operating current from the first bit/source line via a conducted memory cell of the memory bank and the current sink module is activated to drain the operating current from the second bit/source line.

2. The circuit of claim 1, wherein the current source module comprises:
   a current source unit connected to the first bit/source line; and
   a logic gate comprising an output end connected to the current source unit and two input ends;
   wherein when the logic gate receives the select signal with the first state at one of the input ends and receives the triggering pulse at the other one of the input ends from the first bit/source line, the logic gate generates an activating signal at the output end to activate the current source unit, and the current source unit generates the operating current to the first bit/source line.

3. The circuit of claim 2, wherein the current source unit is a PMOS transistor and the logic gate is a NAND gate.

4. The circuit of claim 1, wherein the current sink module comprises:
   a current sink unit connected to the second bit/source line; and
   a logic gate comprising an output end connected to the current sink unit and two input ends;
   wherein when the logic gate receives the select signal with the first state at one of the input ends and receives the triggering pulse at the other one of the input ends from the first bit/source line, the logic gate generates an activating signal at the output end to activate the current sink unit, and the current sink unit drains the operating current from the second bit/source line.

5. The circuit of claim 4, wherein the current sink unit is an NMOS transistor and the logic gate is an AND gate.

6. The circuit of claim 1, wherein the current source module comprises:
   a first current source unit connected to the first bit/source line;
   a first logic gate comprising a first output end connected to the first current source unit and two first input ends configured to receive the select signal and connected to the first bit/source respectively;
   a second current source unit connected to the second bit/source line; and
   a second logic gate comprising a second output end connected to the second current source unit and two second input ends configured to receive the select signal and connected to the second bit/source respectively.

7. The circuit of claim 1, wherein the current sink module comprises:
   a first current sink unit connected to the second bit/source line; and
   a first logic gate comprising a first output end connected to the first current sink unit and two first input ends configured to receive the select signal and connected to the first bit/source respectively;
   a second current sink unit connected to the first bit/source line; and
   a second logic gate comprising a second output end connected to the second current sink unit and two second input ends configured to receive the select signal and connected to the second bit/source respectively.

8. The circuit of claim 1, wherein when each of the current source module and the current sink module receives the select signal with a second state opposite to the first state, the current source module and the current sink module are deactivated.

9. A circuit comprising:
   a plurality of current source modules and a plurality of current sink modules arranged in an interlaced manner, wherein each of the current source modules and the current sink modules is connected to a first bit/source line and a second bit/source line;
   a plurality of memory banks each connected to the first bit/source line and the second bit/source line and each bounded by one of the current source modules and one of the current sink modules neighboring to each other;
   a decoding module connected to the current source modules, the current sink modules, the first bit/source line and the second bit/source line;
   wherein when each of a selected one of the current source modules and a selected one of the current sink modules neighboring to each other receives a select signal with a first state generated by the decoding module, and receives a triggering pulse from the first bit/source line generated by the decoding module, the selected one of the current source modules is activated to generate an operating current, and transmit the operating current from the first bit/source line to the second bit/source line via a conducted memory cell of one of the memory banks bounded by the selected one of the current source modules and the selected one of the current sink modules, and the selected one of the current sink modules is activated to drain the operating current from the second bit/source line.

10. The circuit of claim 9, wherein each of the current source modules comprises:
    a current source unit connected to the first bit/source line; and
    a logic gate comprising an output end connected to the current source unit and two input ends connected to the decoding module and the first bit/source line respectively;
    wherein when the logic gate receives the select signal with the first state at one of the input ends from the decoding module and receives the triggering pulse at the other one of the input ends from the first bit/source line, the logic gate generates an activating signal at the output end to activate the current source unit, and the current source unit generates the operating current to the first bit/source line.

11. The circuit of claim 9, wherein each of the current sink module comprises:
    a current sink unit connected to the second bit/source line; and
    a logic gate comprising an output end connected to the current sink unit and two input ends connected to the decoding module and the first bit/source line respectively;
    wherein when the logic gate receives the select signal with the first state at one of the input ends from the decoding module and receives the triggering pulse at the other one of the input ends from the first bit/source line, the logic gate generates an activating signal at the output end to activate the current sink unit, and the current sink unit drains the operating current from the second bit/source line.

12. The circuit of claim 9, wherein each of the current source modules comprises:
    a first current source unit connected to the first bit/source line;
    a first logic gate comprising a first output end connected to the first current source unit and two first input ends connected to the decoding module and the first bit/source line respectively;
    a second current source unit connected to the second bit/source line; and a second logic gate comprising a second output end connected to the second current source unit and two second input ends connected to the decoding module and the second bit/source line respectively.

13. The circuit of claim 9, wherein each of the current sink modules comprises:
a first current sink unit connected to the second bit/source line; and
a first logic gate comprising a first output end connected to the first current sink unit and two first input ends connected to the decoding module and the first bit/source line respectively;
a second current sink unit connected to the first bit/source line; and
a second logic gate comprising a second output end connected to the second current sink unit and two second input ends connected to the decoding module and the second bit/source line respectively.

14. The circuit of claim 9, wherein when an auxiliary one of the current source modules receives the select signal with the first state from the decoding module, the auxiliary one of the current source modules is activated to generate an auxiliary operating current.

15. The circuit of claim 9, wherein each of the current source modules and the current sink modules is deactivated when the select signal with a second state opposite to the first state is received.

16. A method comprising:
receiving a select signal with a first state by each of a selected one of a plurality of current source modules and a selected one of a plurality of current sink modules neighboring to each other, wherein the current source modules and the current sink modules are arranged in an interlaced manner and each of the current source modules and the current sink modules is connected to a first bit/source line and a second bit/source line;
receiving a triggering pulse from the first bit/source line by the selected one of the current source modules and the selected one of the current sink modules;
activating the selected one of the current source modules to generate an operating current to the first bit/source line;
transmitting the operating current from the first bit/source line to the second bit/source line via a conducted memory cell of one of a plurality of memory banks between the selected one of the current source modules and the selected one of the current sink modules; and
activating the selected one of the current sink modules to drain the operating current from the second bit/source line.

17. The method of claim 16, further comprising:
receiving the select signal with the first state and the triggering pulse by a logic gate of the selected one of the current source modules to generate an activating signal;
activating a current source unit of the selected one of the current source modules by the activating signal; and
generating the operating current to the first bit/source line by the current source unit.

18. The method of claim 16, further comprising:
receiving the select signal with the first state and the triggering pulse by a logic gate of the selected one of the current sink modules to generate an activating signal;
activating a current sink unit of the selected one of the current sink modules by the activating signal; and
draining the operating current from the second bit/source line by the current sink unit.

19. The method of claim 17, further comprising:
receiving the select signal with the first state by an auxiliary one of the current source modules; and
activating the auxiliary one of the current source modules to generate an auxiliary operating current.

20. The method of claim 16, further comprising:
deactivating each of the current source modules and the current sink modules when the select signal with a second state opposite to the first state is received.

* * * * *